United States Patent
Willey et al.

(10) Patent No.: US 11,803,437 B1
(45) Date of Patent: Oct. 31, 2023

(54) WRITE HARDWARE TRAINING ACCELERATION

(71) Applicant: Advanced Micro Devices, Inc., Santa Clara, CA (US)

(72) Inventors: Aaron D Willey, Hayward, CA (US); Karthik Gopalakrishnan, Cupertino, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/854,988

(22) Filed: Jun. 30, 2022

(51) Int. Cl.
*G06F 11/00* (2006.01)
*G06F 11/07* (2006.01)
*G06F 12/123* (2016.01)

(52) U.S. Cl.
CPC .......... *G06F 11/076* (2013.01); *G06F 11/073* (2013.01); *G06F 12/123* (2013.01); *G06F 2212/1008* (2013.01)

(58) Field of Classification Search
CPC ... G06F 11/1072; G06F 11/076; G06F 11/073
See application file for complete search history.

(56) References Cited

U.S. PATENT DOCUMENTS

| 7,730,367 | B2* | 6/2010 | Parthasarathy | H04L 43/50 714/724 |
| 9,413,497 | B2* | 8/2016 | Schnizler | H04L 1/241 |
| 9,998,146 | B2* | 6/2018 | Szczepanek | H03M 13/158 |
| 10,541,845 | B2* | 1/2020 | Stuart | H04L 5/0048 |
| 11,265,011 | B2* | 3/2022 | Szczepanek | H03M 13/158 |
| 2009/0034597 | A1* | 2/2009 | Kobayashi | H04L 1/242 375/224 |
| 2013/0055039 | A1* | 2/2013 | Dearth | G11C 29/028 708/251 |
| 2014/0258795 | A1* | 9/2014 | Schnizler | H04L 1/20 714/705 |

* cited by examiner

*Primary Examiner* — Esaw T Abraham
(74) *Attorney, Agent, or Firm* — Polansky & Associates, P.L.L.C.; Paul J. Polansky; Nathan H. Calvert (57) ABSTRACT

A memory includes a link training circuit with a pseudo-random bit sequence (PRBS) generator and a burst error detection counter. The burst error detection counter including a comparator, a first input coupled to the data input, a second input coupled to the PRBS generator, and a counter operable to increase an error count value by one responsive to detecting any number of errors greater than zero in a sequence of symbols including a predetermined number of symbols.

20 Claims, 8 Drawing Sheets

WRITE HARDWARE TRAINING ACCELERATION

BACKGROUND

Modern dynamic random-access memory (DRAM) provides high memory bandwidth by increasing the speed of data transmission on the bus connecting the DRAM and one or more data processors, such as graphics processing units (GPUs), central processing units (CPUs), and the like. DRAM is typically inexpensive and high density, thereby enabling large amounts of DRAM to be integrated per device. Most DRAM chips sold today are compatible with various double data rate (DDR) DRAM standards promulgated by the Joint Electron Devices Engineering Council (JEDEC). Typically, several DDR DRAM chips are combined onto a single printed circuit board substrate to form a memory module that can provide not only relatively high speed but also scalability.

DDR DRAMs are synchronous because they operate in response to a free-running clock signal that synchronizes the issuance of commands from the host processor to the memory and therefore the exchange of data between the host processor and the memory. DDR DRAMs are responsive to the clock signal to synchronize commands and can use the clock signal to generate read data strobe signals. For example, DDR DRAMs receive write data using a center-aligned data strobe signal known as "DQS" provided by the host processor, in which the memory captures data on both the rising and falling edges of DQS. Similarly, DDR DRAMs provide read data synchronously with an edge-aligned DQS in which the DDR DRAMs provide the DQS signal. During read cycles, the host processor delays the DQS signal internally to align it with the center portion of the DQ signals generally by an amount determined at startup by performing data eye training. Some DDR DRAMs, such as graphics DDR, version six (GDDR6) DRAMs receive both a main clock signal and a separate write clock signal and programmably generate a read data strobe signal.

However, while these enhancements have improved the speed of DDR memory used for computer systems' main memory, further improvements are desirable.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A memory includes a data input circuit for coupling to a data bus with a multi-level pulse-amplitude modulation (PAM) receiver for outputting multi-bit symbols based on receiving a data signal including more than two PAM levels. The memory includes a training circuit with a pseudo-random bit sequence (PRBS) generator and a burst error detection counter. The burst error detection counter including a comparator, a first input coupled to the data input, a second input coupled to the PRBS generator, and a counter operable to increase an error count value by one responsive to detecting any number of errors greater than zero in a sequence of symbols including a predetermined number of symbols.

A method for use by a memory includes, in a write training mode at the memory, receiving a pseudo-random bit sequence (PRBS) encoded into symbols in a multi-level pulse-amplitude modulation (PAM) format including more than two PAM levels on a data line. The method generates an identical PRBS at the memory, and compares the received PRBS with the identical PRBS to detect errors. The method increases an error count value by one responsive to detecting any number of errors greater than zero in a sequence of symbols including a predetermined number of symbols.

A data processing system includes a data processor and a memory coupled to the data processor over a data bus. The memory includes a data input circuit and a training circuit. The data input circuit is for coupling to the data processor over the data bus and including a multi-level pulse-amplitude modulation (PAM) receiver for outputting multi-bit symbols based on receiving a data signal including more than two PAM levels. The training circuit includes a pseudo-random bit sequence (PRBS) generator and a burst error detection counter including a comparator, a first input coupled to the data input, a second input coupled to the PRBS generator, and a counter operable to increase an error count value by one responsive to detecting any number of errors greater than zero in a sequence of symbols including a predetermined number of symbols.

Figure 1:
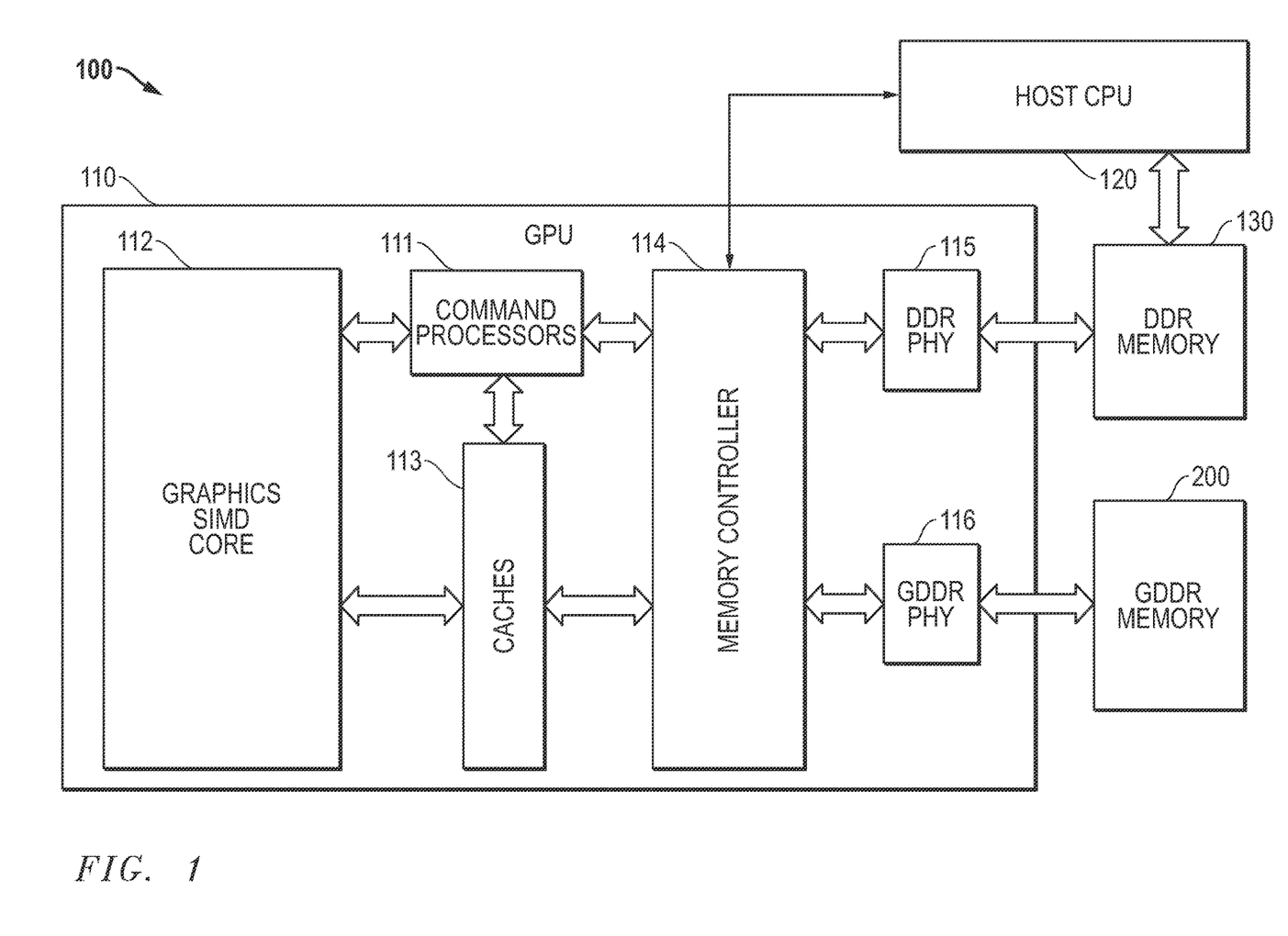
FIG. 1 illustrates in block diagram for a data processing system according to some embodiments.

FIG. 1 illustrates in block diagram for a data processing system 100 according to some embodiments. Data processing system 100 includes generally a data processor in the form of a graphics processing unit (GPU) 110, a host central processing unit (CPU) 120, a double data rate (DDR) memory 130, and a graphics DDR (GDDR) memory 140.

GPU 110 is a discrete graphics processor that has extremely high performance for optimized graphics processing, rendering, and display, but requires a high memory bandwidth for performing these tasks. GPU 110 includes generally a set of command processors 111, a graphics single instruction, multiple data (SIMD) core 112, a set of caches 113, a memory controller 114, a DDR physical interface circuit (PHY) 115, and a GDDR PHY 116.

Command processors 111 are used to interpret high-level graphics instructions such as those specified in the OpenGL programming language. Command processors 111 have a bidirectional connection to memory controller 114 for receiving the high-level graphics instructions, a bidirectional connection to caches 113, and a bidirectional connection to graphics SIMD core 112. In response to receiving the high-level instructions, command processors 111 issue SIMD instructions for rendering, geometric processing, shading, and rasterizing of data, such as frame data, using caches 113 as temporary storage. In response to the graphics instructions, graphics SIMD core 112 executes the low-level instructions on a large data set in a massively parallel fashion. Command processors 111 use caches 113 for temporary storage of input data and output (e.g., rendered and rasterized) data. Caches 113 also have a bidirectional connection to graphics SIMD core 112, and a bidirectional connection to memory controller 114.

Memory controller 114 has a first upstream port connected to command processors 111, a second upstream port connected to caches 113, a first downstream bidirectional port, and a second downstream bidirectional port. As used herein, "upstream" ports are on a side of a circuit toward a data processor and away from a memory, and "downstream" ports are on a side if the circuit away from the data processor and toward a memory. Memory controller 114 controls the timing and sequencing of data transfers to and from DDR memory 130 and GDDR memory 140. DDR and GDDR memory support asymmetric accesses, that is, accesses to open pages in the memory are faster than accesses to closed pages. Memory controller 114 stores memory access commands and processes them out-of-order for efficiency by, e.g., favoring accesses to open pages, disfavoring frequent bus turnarounds from write to read and vice versa, while observing certain quality-of-service objectives.

DDR PHY 115 has an upstream port connected to the first downstream port of memory controller 114, and a downstream port bidirectionally connected to DDR memory 130. DDR PHY 115 meets all specified timing parameters of the implemented version or versions of DDR memory 130, such as DDR version five (DDR5), and performs training operations at the direction of memory controller 114. Likewise, GDDR PHY 116 has an upstream port connected to the second downstream port of memory controller 114, and a downstream port bidirectionally connected to GDDR memory 200. GDDR PHY 116 meets all specified timing parameters of the implemented version of GDDR memory 140, and performs training operations at the direction of memory controller 114, including initial training of the various data and command lanes of GDDR PHY 116, and retraining during operation.

Figure 2:
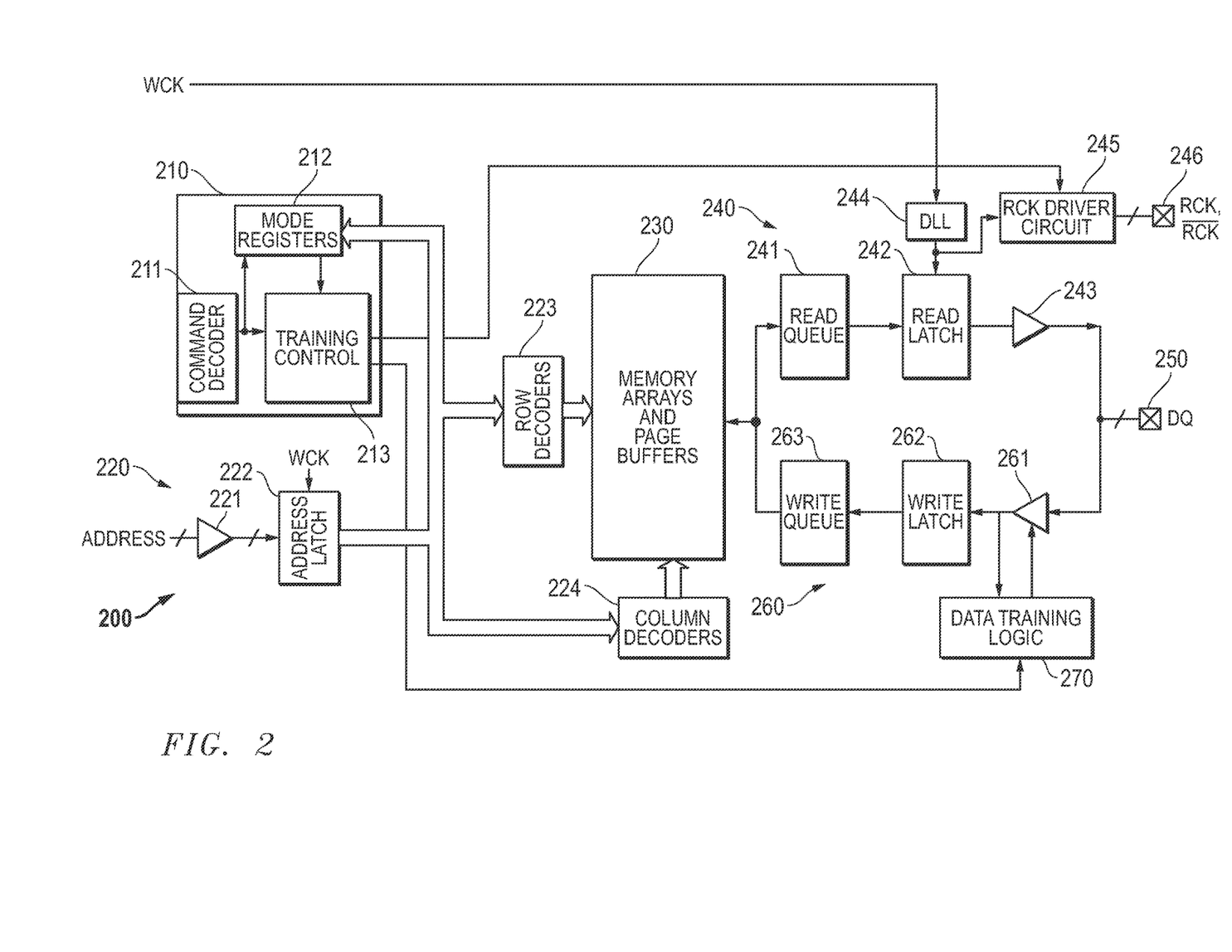
FIG. 2 illustrates in block diagram form the GDDR memory of FIG. 1 according to some embodiments.

FIG. 2 illustrates in block diagram form GDDR memory 200 of FIG. 1 according to some embodiments. GDDR memory 200 generally includes a control circuit 210, an address path 220, memory arrays and page buffers 230, and a data read path 240, a set of bond pads 250, and a data write path.

Control circuit 210 includes a command decoder 211, mode registers 212, and training control circuit 213. Command decoder 211 decodes commands received from command and address pins (not shown in FIG. 2) into one of several supported commands defined by the memory's command truth table. One type of command decoded by command decoder 211 is a mode register set (MRS) command. The MRS command causes the command decoder to provide settings to the indicated mode register in which the settings are contained on the ADDRESS inputs. MRS commands have been known in the context of DRAMs for quite some time, and vary between different GDDR DRAM versions. Mode registers 212 store the programmed settings, and in some cases, output information about the GDDR DRAM. Training control circuit 213 has a first input connected to the output of command decoder 211, a second input connected to certain outputs of mode registers 212, and an output. As will be described further, Training control circuit 213 generally responds to commands from memory controller 114 to place GDDR memory 200 in a PHY training mode in which it directs training logic for input and output buffers to perform link training steps.

Address path 220 receives a multi-bit ADDRESS signal, and includes an input buffer 221 and an address latch 222 for each address signal, a set of row decoders 223, and a set of column decoders 224. Input buffer 221 receives and buffers the corresponding multi-bit ADDRESS signal, and provides a multi-bit buffered ADDRESS signal in response. Address latch 222 has an input connected to the output of input buffer 221, an output, and a clock input receiving a signal labelled "WCK". Address latch 222 latches the bits of the buffered address on a certain clock edge, e.g., the rising edge, and functions not only as a write clock during write commands, but also as a main clock that is used to capture commands. Row decoders 223 have an input connected to the output of address latch 222, and an output. Column decoders 224 have an input connected to the output of address latch 222, and an output.

Memory arrays and page buffers 230 are organized into a set of individual memory arrays known as banks that are separately addressable. For example, GDDR memory 200 may have a total of 16 banks. Each bank can have only one "open" page at a time, in which the open page has its contents read into a corresponding page buffer for faster read and write accesses. Row decoders 223 select a row in the accessed bank during an activate command, and the contents of the indicated row are read into the page buffer and the row is ready for read and write accesses. Column decoders 224 select a column of the row in response to a column address.

Data read path 240 includes a read queue 241, a read latch 242, an output buffer 243, a delay locked loop (DLL) 244, and an RCK and RCK pins. Read queue 241 has an input connected to an output of memory arrays and page buffers 230, and an output. Read latch 242 has in input connected to the output of read queue 241, a clock input, and an output. Buffer 243 has an input connected to the output of read latch 242, and an output connected to bond pads 250. DLL 244 has an input receiving a write clock signal labelled "WCK", and an output connected to the clock input of read latch 242. It should be noted DLL 244 is optional in present GDDR standards, which are architected to tolerate drift on the RCK signal with respect to DQ in communicating read command results. RCK driver circuit 245 has an input connected to the output of DLL 244, a control input (not shown), and an output connected to the RCK and RCK pins.

Write data path 260 includes an input buffer 261, a write latch 262, and a write queue 263. Input buffer 261 has an input connected to a set of bond pads 250 labelled "DQ", and an output. Write latch 262 has in input connected to the output of input buffer 261, and an output. Write queue 263 has an input connected to the output of write latch 262, and an output connected to memory arrays and page buffers 230.

Data training logic 270 has an input connected to training control circuit 213, and inputs and output connected to input buffer 261 and output buffer 243 for performing training functions.

In operation, GDDR memory 200 allows concurrent operations in the memory banks and in one embodiment, GDDR memory 200 is compatible with one of the double data rate (DDR) standards published by the Joint Electron Device Engineering Council (JEDEC). In order to access data, a memory accessing agent such as GPU 110 activates a row in a memory bank by issuing an activate ("ACT") command. In response to the ACT command, data from memory cells along the selected row are stored in a corresponding page buffer. In DRAMs, data reads are destructive to the contents of the memory cells, but a copy of the data is stored in the page buffer. After memory controller 114 finishes accessing data in the selected row of a bank, it closes the row by issuing a precharge ("PRE") command (or write or read command with auto-precharge, or a precharge all command). The PRE command causes the data in page buffer 124 to be rewritten to its row in the selected bank, allowing another row to then be activated. These operations are conventional in DDR memories and described in the various JEDEC standard documents and will not be described further.

According to various embodiments disclosed herein, however, GDDR memory 200 includes a modified set of mode registers 212 that, compared to existing standards such as GDDR6, adds mode register fields and command decoder functions that can be used to define the behavior of training control circuit 213 and data training logic 270 to perform additional training functions as further described below.

Figure 3:
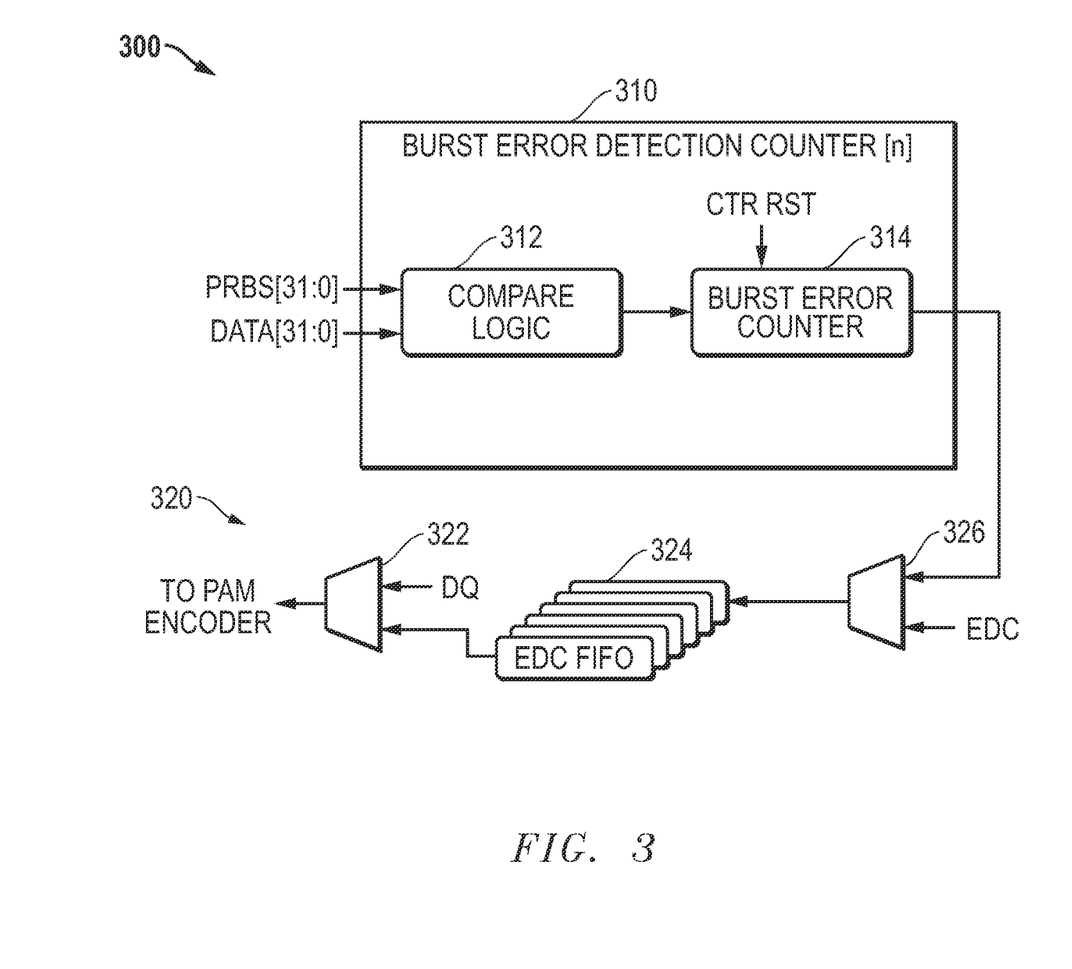
FIG. 3 illustrates in block diagram form a portion of a data training logic circuit suitable for use as the data training logic circuit of FIG. 2.

FIG. 3 illustrates in block diagram form a portion of a data training logic circuit 300 suitable for use as data training logic circuit 270 of FIG. 2. The diagram shows only the relevant portions of data training logic 300 to avoid obscuring the invention. Data training logic 300 generally includes a burst error detection counter 310 and reporting path 320. Generally, burst error detection counter 310 detects errors related to a single DQ input of memory 200, and is repeated for each DQ lane, as indicated by the label "[n]". For example, in one implementation, PAM3 signaling is used for the DQ lanes, and ten data lanes (DQ[0:7], DQX, DQY, and DQE) each include a burst error detection counter 310.

Burst error detection counter 310 includes a comparison logic circuit 312 and a burst error counter 314. Comparison logic circuit 312 has a first input receiving a received data signal labeled "DATA[31:0]", a second input receiving a pseudo-random bit sequence labeled "PRBS[31:0]", and an output. Burst error counter 314 has an input connected to the output of comparison logic 312, a counter reset input labeled "CTR RST", and an output.

Reporting path 320 generally provides a signaling pathway to report error counts during link training, inserting the error count data into the error detection code (EDC) data pathway. Reporting path 320 includes a multiplexer 322, a first-in-first-out (FIFO) buffer 324 labeled "EDC FIFO", and a multiplexer 326. Multiplexer 326 has a first input receiving the DRAM's EDC signal (for normal operation), a second input connected to the output of burst error counter 314 for write training operations, a control input (not shown), and an output. EDC FIFO 324 has an input connected to the output of multiplexer 326, and an output. Multiplexer 322 has a first input connected to the output of EDC FIFO 324, a second input labeled "DQ", a control input (not shown), and an output labeled "TO PAM ENCODER".

In operation, during a write training (WRTR) mode, a training pattern is received over by the PAM receiver for the DQ lane (e.g., FIG. 2, 261), and decoded into symbols which are fed to the DATA[31:0] input of comparison logic 312. A PRBS generator generates the training pattern locally for comparison and feeds it to the PRBS[31:0] input of comparison logic 312. Comparison logic detects errors with XOR comparison, and outputs a HIGH signal to burst error counter 314 each time an error is detected in a symbol. Burst error counter 314 is a 12-bit burst error counter operable to increase an error count value by one responsive to detecting any number of errors greater than zero in a sequence of symbols including a predetermined number of symbols. The counter value is then reported back to the memory controller over the DQE lane for the training pattern by controlling multiplexers 322 and 326. For example, in one implementation, bursts of 16 symbols are used, and burst error counter 314 increases by one if any number of errors are present in a 16-symbol burst, and does not increase if no error are present. While burst errors are counted in this implementation, other implementations may include a configuration mode for burst error detection counter 310 in which it counts individual errors within the burst.

The depicted arrangement enables multiple readout cycles of WRTR data, with a linear-feedback shift register (LFSR) incremented to produce a different PRBS training pattern for each cycle. This arrangement reduces write training time while improving accuracy. Without the use of the error counter, only a pass/fail boundary is detected during WRTR cycles. Using the error counter, the DQ lane data eye's leading and trailing edge failure density can be judged by the host to make a phase adjustment update during the training. The host is also able to measure failure rate gradients. While a burst error counter is used in this implementation, in some implementations the counter may be operated in a normal error counter mode in which each error in a burst increases the counter value. The use of error counters also allows an XOR logic mode in which data eye margining can be performed without reference to write training can be performed without reference to the LFSR pattern, as further described below.

The depicted arrangement also has the advantage that the error count value for a burst can be transmitted by the PAM encoder in a single burst. Preferably, in the WRTR mode, the DQ lane's PAM encoder is operated using only two of the multiple PAM levels, avoiding errors and simplifying the PAM encoding process. For example, in PAM3 encoding, only the +1 and −1 levels are used to transmit error counts.

Figure 4:
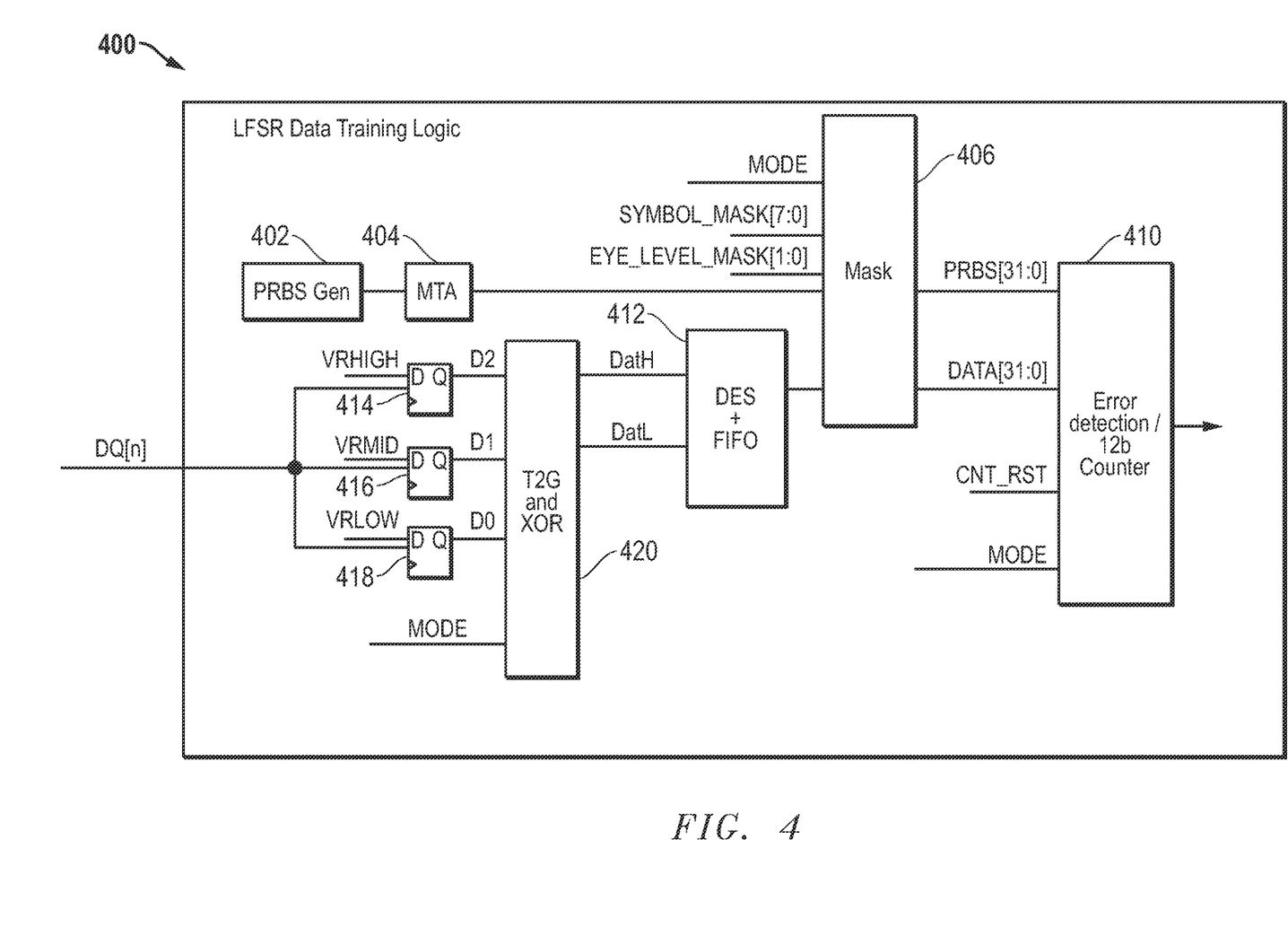
FIG. 4 illustrates in block diagram form a data training logic circuit according to some additional embodiments.

FIG. 4 illustrates in block diagram form a data training logic circuit 400 according to some additional embodiments. Data training logic circuit 400 is suitable for use as data training logic circuit 270 of FIG. 2. Generally, data training logic circuit includes a symbol masking capability, and an XOR logic mode in which data eye margining can be performed without reference to write training and can be performed without reference to the LFSR pattern.

Data training logic circuit 400 includes a PRBS generator 402, a maximum transition avoidance (MTA) encoder 404, a masking circuit 406, a burst error detection counter 410, a deserializer and FIFO circuit 412 labeled "DES+FIFO", a thermometer to grey and XOR circuit 420 labeled "T2G and XOR", and three flip-flops 414, 416, and 418.

PRBS generator 402 has a control input (not shown) and an output, and generally includes at least one LFSR along with control logic for initializing the LFSR. MTA encoder 404 has an input connected to the output of PRBS generator 402 and an output. Masking circuit 406 has a first mode input for receiving a mode signal labelled "MODE", a symbol mask input labelled "SYMBOL_MASK[7:0]", an eye mask input labelled "EYE_LEVEL_MASK[1:0]", two data inputs, first output labelled "PRBS[31:0]", and a second output labelled "DATA[31:0]".

Burst error detection counter 410 has a first input connected to the PRBS[31:0] output of masking circuit 406, a second input connected to the DATA[31:0] output of masking circuit 406, a counter reset input labelled "CNT_RST", a mode input, and a counter output.

Each of flip-flops 414, 416, and 418 has a "D" input, a clock input, and a "Q" output. Three reference voltages, labelled "VRHIGH", "VRMID", and "VRLOW" are connected to the D inputs of flip-flops 414, 416, and 418 respectively. T2G and XOR circuit 420 has a first input receiving a signal "D0" from the output of flip-flop 418, a second input receiving a signal "D1" from the output of flip-flop 416, a third input receiving a signal "D2" from the output of flip-flop 414, a mode input, a first output labelled "DatH", and a second output labelled "DatL". Flip-flops 414, 416, and 418 are specialized flip-flop circuits that function as level detectors or comparators (also known as slicers) of a PAM receiver, with their clock inputs all connected to the DQ lane signal labelled "DQ[n]", and their three outputs indicating whether the DQ signal is higher than the respective reference voltage inputs VRHIGH, VRMID, and VRLOW. T2G and XOR circuit 420 generally acts as a PAM decoder for the PAM receiver, and operates in two different modes, either as a PAM level decoder or an XOR comparison circuit for performing self-reference comparisons, as further described below with respect to FIGS. 5-7.

Deserializer and FIFO circuit 412 has a first input receiving the DatH output from T2G and XOR circuit 420, a second input receiving the DatL output from T2G and XOR circuit 420, and an output connected to the data input of mask circuit 406. Deserializer and FIFO circuit 812 is an FIFO buffer which converts the incoming serial data streams of DatH and DatL to a 32-bit wide data signal at its output.

In operation, data training logic circuit 400 is able to operate similarly to that of FIG. 3, comparing received data over DQ[n] with data produced by PRBS 402, and includes masking capabilities and receiver XOR comparison capabilities. Mask circuit 406 can apply either eye level masking or symbol level masking, selectable by the mode input. Eye level masking generally includes remapping the PAM decoder output to isolate either the upper eye or lower eye as controlled by the EYE_LEVEL_MASK[1:0] input. Symbol level masking provides the ability to isolate selected symbols in a burst as controlled by the SYMBOL_MASK [7:0] input. The symbol level masking is applied by causing the selected masked symbol bits to all be zero in both the PRBS and the received data, thus leaving only the bits to be examined to be passed to be fed to the comparison logic for error checking and error counting. The symbol level masking capability provides improvements for training by allowing isolation of bits that may frequently have errors because of system noise, and therefore may generally distort the overall eye training. For example, the first symbol in a burst may be masked to avoid the effects of power noise that may be present on the first symbol. Such a mask may be applied constantly during training. As another example, individual symbols may be masked off sequentially to capture data such as deviations.

Figure 5:
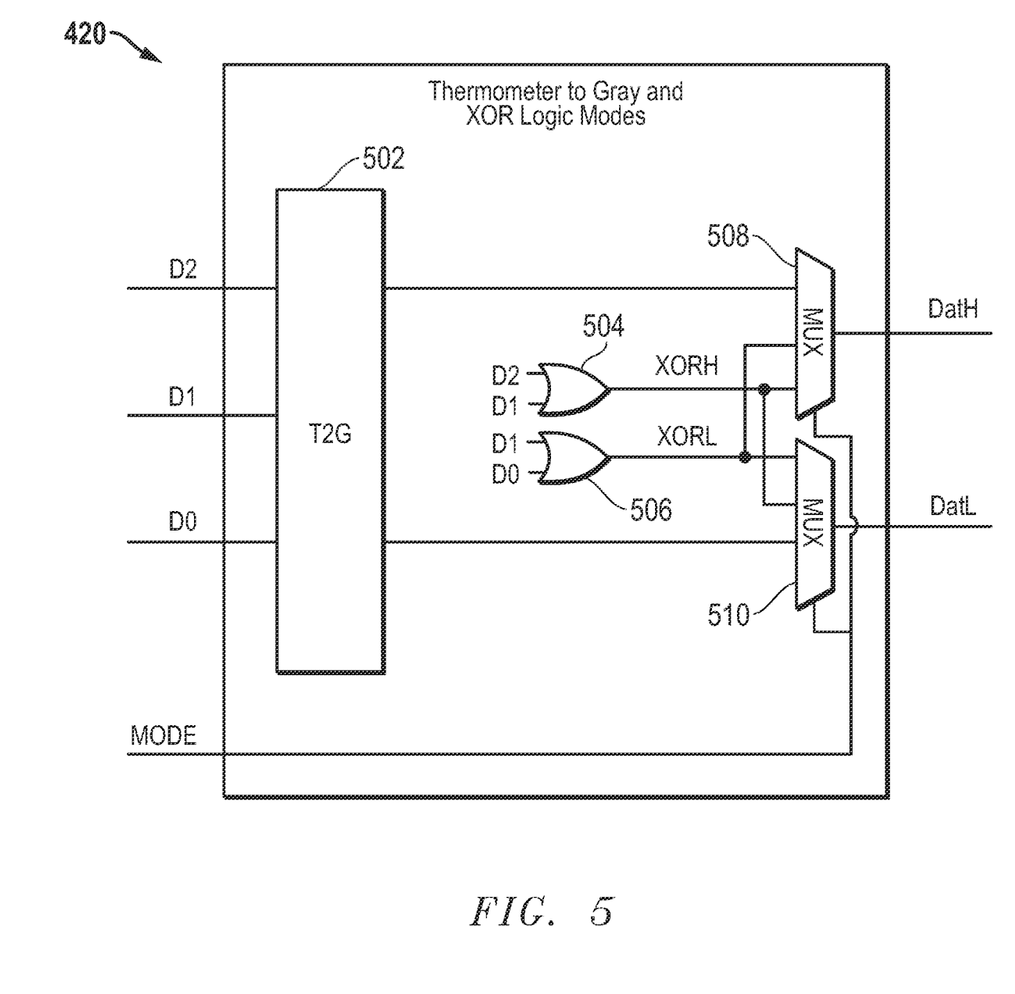
FIG. 5 illustrates in block diagram form a more detailed view of the thermometer to grey (T2G) and XOR circuit of FIG. 4.

Referring to T2G and XOR circuit 420, shown in more detail in FIG. 5, includes a thermometer to grey encoder 502, two XOR gates 504 and 506, and two multiplexers 508 and 510. T2G and XOR circuit 420 replaces the ordinary T2G encoder of the PAM receiver (such as a PAM3 or PAM4 receiver) in order to add self-comparison capabilities. T2G encoder 502 has three inputs and two outputs. It receives the three inputs D0, D1, and D2 and produces a two-bit code on the outputs. XOR gate 504 also receives inputs D1 and D2, while XOR gate 506 receives inputs D0 and D1. XOR gates 504 has an output labeled "XORH", and XOR gate 506 has an output labeled "XORL". XORL and XORH are fed to respective inputs of both multiplexer 508 and multiplexer 510. While a thermometer to grey encoder is used in this implementation, other implementations may use other suitable encoders, such as, for example, a thermometer to binary encoder.

Multiplexor 508 has a first input connected to the first output of T2G encoder 502, second and third inputs receiving the outputs of XOR gates 504 and 506, and a control input connected to the MODE input. Similarly, multiplexor 510 has a first input connected to the second output of T2G encoder 502, second and third inputs receiving the outputs of XOR gates 504 and 506, and a control input connected to the MODE input. In the normal operating mode, multiplexors 508 and 510 pass the T2G encoder outputs on to DatH and DatL. In the XOR comparison mode, multiplexors 508 and 510 pass the results of XOR comparisons of either D0 and D1, or D1 and D2, as selected by the MODE input. In this implementation, the MODE input is a two-bit binary number configuring the multiplexors to pass the desired data. A "0" value passes the T2G encoder outputs to DatH and DatL. A "1" value passes XORH only to both DatH and DatL. A "2" value passes XORL only to both DatH and DatL. A "3" value passes XORH to DatH and XORL to DatL. The XOR comparison data is used together with selectively varying VRHIGH, VRMID, and VRLOW to perform self-referenced training of the data eyes of the PAM receiver, as further described with respect to FIGS. 6-7 below.

Figure 6:
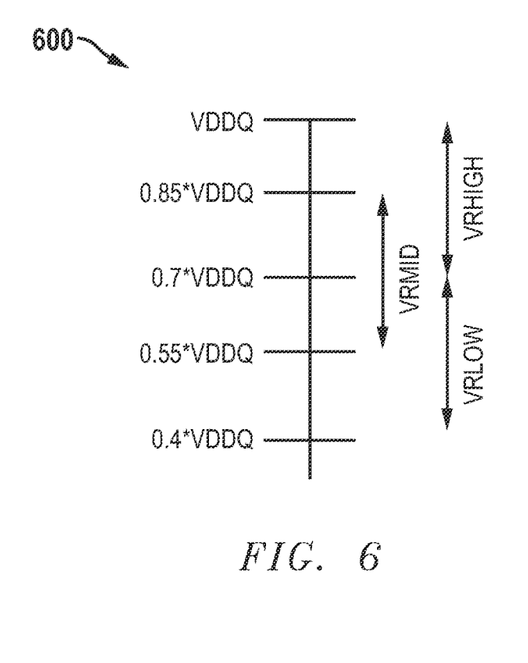
FIG. 6 shows a diagram illustrating variation of references voltages for a PAM receiver according to some embodiments.

FIG. 6 shows a diagram 600 illustrating variation of references voltages for a PAM receiver according to some embodiments. Depicted is a scale showing the signaling supply voltage VDDQ, and the variation ranges for the reference voltages VRMID, VRHIGH, and VRLOW during normal operation. (VDDQ may vary or be set to different levels, requiring different values for the reference voltages). The adjustable reference voltages, part of a normal PAM receiver, allow a new technique of eye training as illustrated in FIG. 7.

Figure 7:
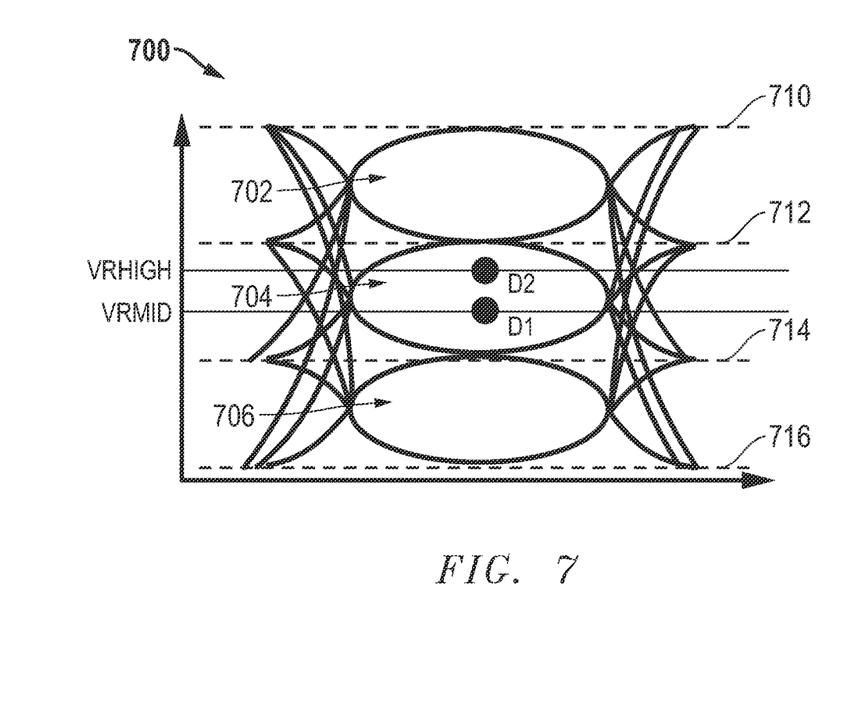
FIG. 7 shows an eye diagram illustrating an XOR eye margining process using self-referencing according to some embodiments.

FIG. 7 shows an eye diagram 700 illustrating an XOR eye margining process using self-referencing according to some embodiments. The vertical axis represents the voltage on DQ[n], and the horizontal axis represents time. While data eyes are shown for a PAM4 signal, the same process may be used for other PAM signaling schemes such as PAM3, PAM6, or PAM8, for example.

Referring to both FIG. 6 and FIG. 7, the depicted eye diagram includes three data eyes 702, 704, and 706 defined by overlapping numerous voltage transitions. The normal expected upper and lower boundaries of the eyes are shown at levels 710, 712, 714, and 716. In normal operation of the PAM receiver, the reference voltage VRHIGH, VRMID, and VRLOW go to three different slicers or comparators (such as the flip-flops 414, 416 and 418 used for this purpose in the circuit of FIG. 4) to identify the voltage level of DQ[n]. In the XOR self-reference mode, the reference voltages have a different role, that of finding the margins of the data eye for a single data eye at a time.

In this process, two of the slicers have their reference voltages adjusted to make sample comparisons in the same eye. The third reference voltage, and the output of its slicer, are ignored for this process. In the depicted example scenario of FIG. 7, data eye 704 is being tested for training the phase delay of each DQ[n] driver. VRMID is set to a magnitude at the middle of the expected voltage range between levels 712 and 714. VRHIGH is adjusted up and down in value and the outputs of the slicer (D1 and D2 in this case) are fed to XOR gate 504 to determine whether they detect the same value. For each sample of each bit period, the XOR output indicates whether D1 and D2 are equal or not. As VRHIGH is swept through the range from level 712 to 714 over successive samples, eventually D1 and D2 will change from equal to not equal, indicating that the envelope of the eye is at the current level of VRHIGH. The phase offset of the DQ[n] driver is adjusted forward and backward during this process to detect the envelope edges or margins of the eye. With these margins identified, the phase offset is then set to the central phase offset point (i.e., the point furthest away from the identified envelope edges).

This XOR self-reference process does not require a particular data pattern, and does not compare the received D1 and D2 with anything but the other value of the pair. Therefore, it does not require coordinating the initialization and timing of a data pattern from the DQ[n] driver and the PRBS generator, which is not used in this process. Further, the process can be used to detect the shape of the eye envelope at all four corners to detect anomalies. Finally, the process can be used with different PAM signaling arrangements as discussed above, for example with PAM3, PAM6, or PAM8.

The process is then repeated for data eyes 702 and 706 to locate the edges of their envelopes. As can be understood, it does not matter which pair of reference voltages are used, but in this implementation VRMID is one of the pair used for each eye because XOR gates 504 and 506 each use D1. In this implementation VRMID is held at a value central to data eye 704, but VRHIGH or VRLOW could be used for this role as well, with VRMID being swept. Preferably, each reference voltage is adjustable through the entire range of VDDQ or at least through the entire range expected of any slicer reference voltage. At a minimum, at least one reference voltage should be adjustable to center of each eye, and at least one other reference voltage should be adjustable to sweep through the expected voltage range of the eye.

In the embodiment of FIG. 4, the output of the XOR comparison is fed to the burst error detection counter 410, which counts detections of different PAM levels by the XOR comparison as errors to detect an outer margin of a data eye for PAM receiver. In this manner, the same comparison logic can be used for the XOR self-reference process as is used for training with training sequences.

Figure 8:
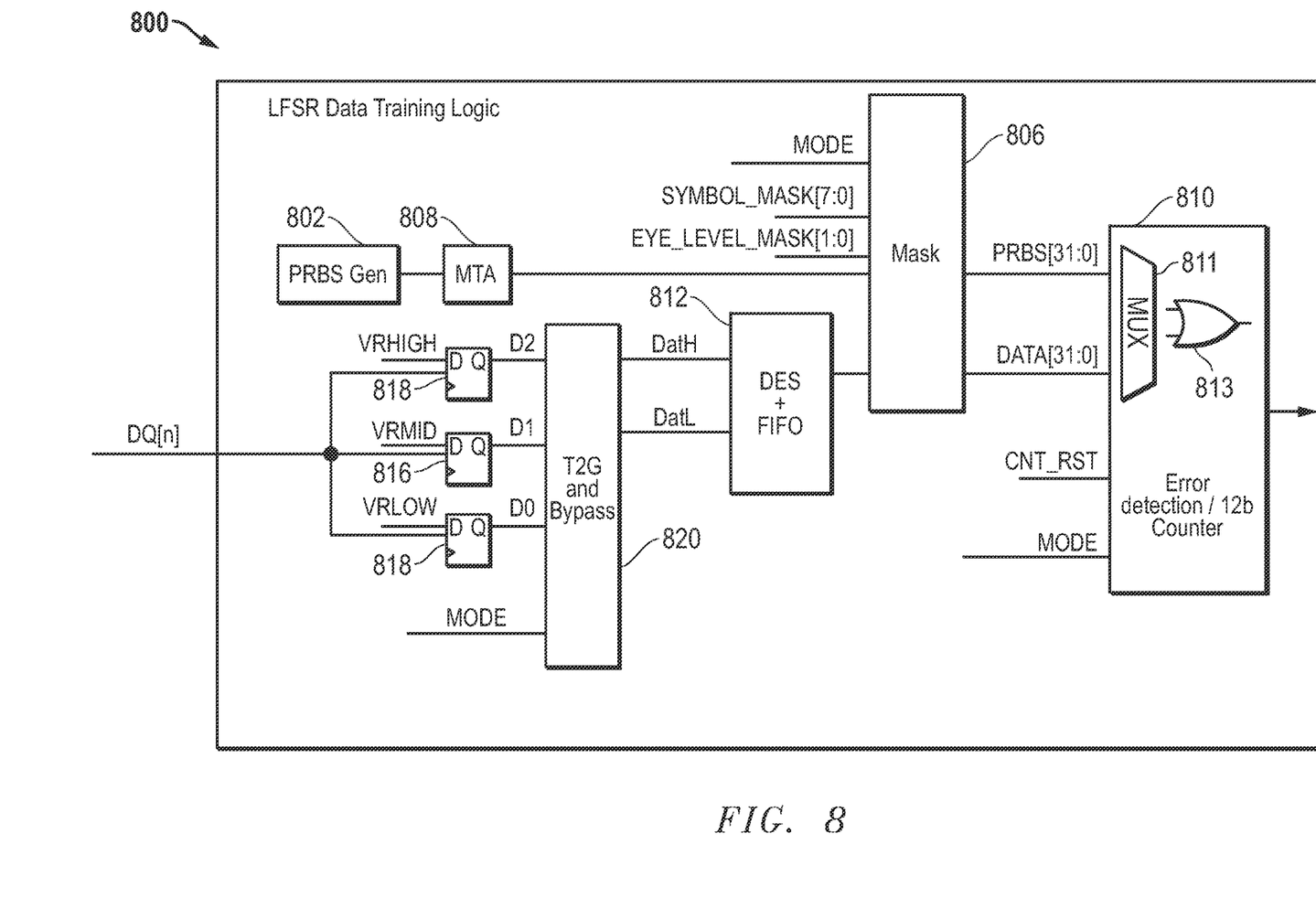
FIG. 8 illustrates in block diagram form a data training logic circuit 800 according to some additional embodiments.

FIG. 8 illustrates in block diagram form a data training logic circuit 800 according to some additional embodiments. Data training logic circuit 800 is suitable for use as data training logic circuit 270 of FIG. 2. Generally, data training logic circuit 800 has the same symbol masking capability as the circuit of FIG. 4, and a similar XOR logic mode in which data eye margining can be performed, but the XOR logic mode is implemented differently in this embodiment.

Data training logic circuit 800 includes a PRBS generator 802, a maximum transition avoidance (MTA) encoder 804, a masking circuit 806, a burst error detection counter 810, a deserializer and FIFO circuit 812 labeled "DES+FIFO", a thermometer to grey and bypass circuit 820 labeled "T2G and Bypass", and three flip-flops 814, 816, and 818. It should be noted that some implementations employ PAM3 signaling and do not require an MTA encoder.

PRBS generator 802 has a control input (not shown) and an output, and generally includes at least one LFSR along with control logic for initializing the LFSR. MTA encoder 804 has an input connected to the output of PRBS generator 802 and an output. Masking circuit 806 has a first mode input, a symbol mask input labelled "SYMBOL_MASK[7:0]", a eye mask input labelled "EYE_LEVEL_MASK[1:0]", a data input, first output labelled "PRBS[31:0]", and a second output labelled "DATA[31:0]".

Each of flip-flops 814, 816, and 818 has a "D" input, a clock input, and a "Q" output. Three reference voltages, labelled "VRHIGH", "VRMID", and "VRLOW" are connected to the D inputs of flip-flops 814, 816, and 818 respectively. T2G and Bypass circuit 820 has a first input receiving a signal "D0" from to the output of flip-flop 818, a second input receiving a signal "D1" from the output of flip-flop 816, a third input receiving a signal "D2" from the output of flip-flop 814 a mode input, a first output labelled "DatH", and a second output labelled "DatL". Flip-flops 814, 816, and 818 generally function as level detectors or comparators of a PAM receiver, with their clock inputs all connected to the DQ lane signal labelled "DQ[n]", and their three outputs indicating whether the DQ signal is higher than the respective reference voltage inputs VRHIGH, VRMID, and VRLOW.

Deserializer and FIFO circuit 812 has a first input receiving the DatH output from T2G and Bypass circuit 820, a second input receiving the DatL output from T2G and Bypass circuit 820, and an output connected to the data input of mask circuit 806. Deserializer and FIFO circuit 812 is an FIFO buffer which converts the incoming serial data streams of DatH and DatL to a 32-bit wide data signal at its output.

Burst error detection circuit 810 has a first input connected to the PRBS[31:0] output of masking circuit 806, a second input connected to the DATA[31:0] output of masking circuit 806, a counter reset input labelled "CNT_RST", a mode input, and a counter output. In this embodiment, burst error detection circuit 810 is similar to circuit 310 of FIG. 3, but includes a multiplexer 811 between the data inputs and its comparison logic 813, allowing circuit 810 to use comparison logic 813 for comparing PRBS[31:0] to DATA[31:0] in a normal error counting mode, but compare the two bit streams on DatH and DatL when in the XOR comparison mode. In this manner, the XOR self-reference comparisons discussed above can be completed by setting T2G and Bypass circuit 820 into a bypass mode, as further described below, and comparing the desired pairs from signal D0, D1, and D2 in Burst error detection circuit 810.

In operation, data training logic circuit 800 is able to operate similarly to the circuit of FIG. 3, comparing received data over DQ[n] with data produced by PRBS 802, and includes masking capabilities and receiver XOR comparison capabilities. Mask circuit 806 can apply either eye level masking or symbol level masking, selectable by the mode input, as discussed above with respect to FIG. 4.

Figure 9:
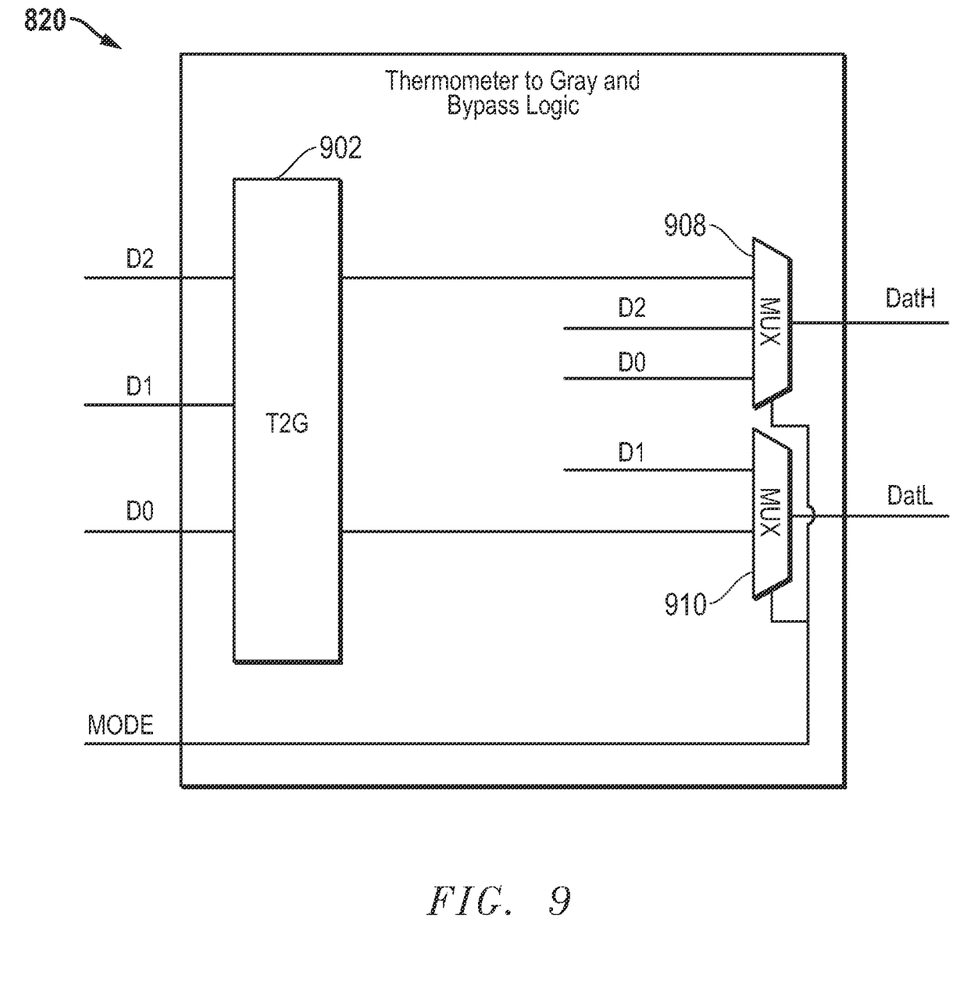
FIG. 9 illustrates in block diagram form a more detailed view of the T2G and Bypass circuit of FIG. 8.

FIG. 9 illustrates in block diagram form a more detailed view of T2G and Bypass circuit 820 of FIG. 8. T2G and Bypass circuit 820 includes a thermometer to grey encoder 902, and two multiplexers 908 and 910. T2G and Bypass circuit 820 replaces the ordinary T2G encoder of the PAM receiver (such as a PAM3 or PAM4 receiver) in order to add bypass capabilities. T2G encoder 902 has three inputs and two outputs. It receives the three inputs D0, D1, and D2 and produces a two-bit code on the outputs.

Multiplexor 908 has a first input connected to the first output of T2G encoder 902, second and third inputs receiving the D2 and D0 inputs, and a control input connected to the MODE input, and an output. Multiplexor 910 has a first input connected to the second output of T2G encoder 902, a second input receiving the D1 input, and a control input connected to the MODE input, and an output.

In the normal operating mode, multiplexors 908 and 910 pass the T2G encoder outputs on to DatH and DatL. The MODE control input, a 2-bit signal, uses "0" to set the normal mode, "1" to pass D2 to DatH and D1 to DatL for XOR comparison in burst error detection counter 810, and "2" to pass D0 to DatH and D1 to DatL for XOR comparison in burst error detection counter 810.

Memory 200 of FIG. 2 such as data training logic circuits 300, 400, and 800, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a hardware description language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, while GDDR memory is described as employing the techniques herein, other types of DRAM or other memory types may also benefit from link training techniques and circuits described above. As another example, the burst error detection counters herein may also be configured to count individual errors within a burst. The length of bursts and the size of data paths may of course vary across different configurations of memory. Finally, the XOR self-reference training techniques described with respect to FIGS. 4-7 may be used for training a variety of communication links that employ PAM signaling, and do not necessarily require the burst error detection counter arrangements herein. A variety of counter arrangements may be used to count the mismatch of paired signals employed in the process of FIGS. 6-7. Accordingly, it is intended by the appended claims to cover all modifications of the disclosed embodiments that fall within the scope of the disclosed embodiments.

What is claimed is:

1. A memory, comprising:
    a data input circuit for coupling to a data bus and including a multi-level pulse-amplitude modulation (PAM) receiver for outputting multi-bit symbols based on receiving a data signal including more than two PAM levels; and
    a training circuit comprising:
        a pseudo-random bit sequence (PRBS) generator; and
        a burst error detection counter including a comparator, a first input coupled to the data input, a second input coupled to the PRBS generator, and a counter operable to increase an error count value by one responsive to detecting any number of errors greater than zero in a sequence of symbols including a predetermined number of symbols.

2. The memory of claim 1, further comprising:
    a plurality of data input circuits each with a respective training circuit like that of claim 1; and
    a first-in-first-out buffer coupled to the burst error detection counter and operable to hold values from the counter during a write training sequence and provide the values to a host requestor responsive to a designated command to the memory.

3. The memory of claim 2, wherein:
    the predetermined number of symbols is 16 symbols, and the counter is a 12-bit counter.

4. The memory of claim 1, further comprising:
    a masking circuit coupled between the PRBS generator and the second input of the burst error detection counter for selectively masking one or more selected bits of symbols such that errors are not detected by the burst error detection counter for the one or more selected bits.

5. The memory of claim 1, wherein:
    the multi-level PAM receiver includes at least two reference voltage inputs for receiving respective reference voltages defining boundaries of the PAM levels; and
    the multi-level PAM receiver is configurable to operate in an exclusive-OR (XOR) self-reference mode in which a first one of the reference voltages is set to a level central to a selected one of the PAM levels, and a second one of the reference voltages is adjusted within the selected PAM level during a training sequence, and an XOR comparison is made within the multi-bit symbols output by the multi-level PAM receiver to detect when the adjustment of the second one of the reference voltages causes a detection of a different PAM level.

6. The memory of claim 5, wherein:
    an output of said XOR comparison is fed to the burst error detection counter, which counts detections of different PAM levels by the XOR comparison as errors to detect an outer margin of a data eye for PAM receiver.

7. A method for use by a memory, comprising:
    (a) in a write training mode at the memory, receiving a pseudo-random bit sequence (PRBS) encoded into symbols in a multi-level pulse-amplitude modulation (PAM) format including more than two PAM levels on a data line;
    (b) generating an identical PRBS at the memory;
    (c) comparing the received PRBS with the identical PRBS to detect errors; and
    (d) increasing an error count value by one responsive to detecting any number of errors greater than zero in a sequence of symbols including a predetermined number of symbols.

8. The method of claim 7, wherein:
    performing (a)-(d) simultaneously for a plurality of data lines at the memory for a write training sequence;
    loading the error count values for the plurality of data lines for the write training sequence to first-in-first-out (FIFO) buffers; and
    transmitting the error count values from the memory to a host memory controller.

9. The method of claim 8, wherein:
    the predetermined number of symbols is 16 symbols, and the increasing is performed using a 12-bit counter.

10. The method of claim 7, further comprising:
    selectively masking one or more selected bits of symbols such that errors are not detected for the one or more selected bits for increasing the error count value.

11. The method of claim 7, further comprising:
    selectively operating a multi-level PAM receiver in an exclusive-OR (XOR) self-reference mode in which a reference voltage is set to a level central to a selected PAM level, and a second reference voltages is adjusted within the selected PAM level during a training sequence; and making an XOR comparison within multi-bit symbols output by the multi-level PAM receiver to detect when the adjustment of the second reference voltage causes a detection of a different PAM level.

12. The method of claim 11, wherein:
in the XOR self-reference mode, counting detections of different PAM levels by the XOR comparison as errors to detect an outer margin of a data eye for the data line.

13. A data processing system, comprising:
a data processor;
a memory coupled to the data processor over a data bus, the memory comprising:
  a data input circuit for coupling to the data processor over the data bus and including a multi-level pulse-amplitude modulation (PAM) receiver for outputting multi-bit symbols based on receiving a data signal including more than two PAM levels; and
  a training circuit comprising:
    a pseudo-random bit sequence (PRBS) generator; and
    a burst error detection counter including a comparator, a first input coupled to the data input, a second input coupled to the PRBS generator, and a counter operable to increase an error count value by one responsive to detecting any number of errors greater than zero in a sequence of symbols including a predetermined number of symbols.

14. The data processing system of claim 13, wherein the memory further comprises:
a plurality of data input circuits each coupled to a respective data line of the data bus and including a respective training circuit like that of claim 13; and
a first-in-first-out buffer coupled to the burst error detection counter and operable to hold values from the counter during a write training sequence and provide the values to a host requestor responsive to a designated command to the memory.

15. The data processing system of claim 14, wherein:
the predetermined number of symbols is 16 symbols, and the counter is a 12-bit counter.

16. The data processing system of claim 14, wherein:
the data processor includes a memory controller operable to command the memory to activate a training mode in which the training circuit is activated and to transmit a write sequence to the memory including the PRBS.

17. The data processing system of claim 13, further comprising:
a masking circuit coupled between the PRBS generator and the second input of the burst error detection counter for selectively masking one or more selected bits of symbols such that errors are not detected by the burst error detection counter for the one or more selected bits.

18. The data processing system of claim 13, wherein:
the multi-level PAM receiver includes at least two reference voltage inputs for receiving respective reference voltages defining boundaries of the PAM levels; and
the multi-level PAM receiver is configurable to operate in an exclusive-OR (XOR) self-reference mode in which a first one of the reference voltages is set to a level central to a selected one of the PAM levels, and a second one of the reference voltages is adjusted within the selected PAM level during a training sequence, and an XOR comparison is made within the multi-bit symbols output by the multi-level PAM receiver to detect when the adjustment of the second one of the reference voltages causes a detection of a different PAM level.

19. The data processing system of claim 18, wherein:
an output of said XOR comparison is fed to the burst error detection counter, which counts detections of different PAM levels by the XOR comparison as errors to detect an outer margin of a data eye for the PAM receiver.

20. The data processing system of claim 19, wherein:
the data processor includes a memory controller which receives an error count indicating an outer margin for a data eye for the data line and makes at least one adjustment to a multi-level PAM transmitter phase offset based on the received error count.

* * * * *